(12) United States Patent
Tsuji (10) Patent No.: US 7,130,025 B2
(45) Date of Patent: Oct. 31, 2006

(54) ILLUMINATION APPARATUS, EXPOSURE APPARATUS AND DEVICE MANUFACTURING METHOD

(75) Inventor: Toshihiko Tsuji, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/082,508

(22) Filed: Mar. 17, 2005

(65) Prior Publication Data

US 2005/0206871 A1    Sep. 22, 2005

(30) Foreign Application Priority Data

Mar. 18, 2004   (JP) .............................. 2004-078065

(51) Int. Cl.
    *G03B 27/72*    (2006.01)
    *G03B 27/54*    (2006.01)
(52) U.S. Cl. .......................................... 355/71; 355/67
(58) Field of Classification Search ................ 355/53, 355/55, 67–71; 250/548; 356/399–401
    See application file for complete search history.

(56) References Cited

U.S. PATENT DOCUMENTS

| 5,459,000 | A | 10/1995 | Unno |
| 5,489,986 | A * | 2/1996 | Magome et al. ............ 356/401 |
| 5,872,617 | A | 2/1999 | Unno |
| 6,661,499 | B1 * | 12/2003 | Omura et al. ................. 355/71 |
| 6,836,365 | B1 * | 12/2004 | Goto ........................... 359/569 |
| 6,876,437 | B1 * | 4/2005 | Kawahara ..................... 355/67 |
| 6,930,758 | B1 * | 8/2005 | Schuster et al. .............. 355/67 |
| 2001/0055107 | A1 | 12/2001 | Tsuji |
| 2002/0177048 | A1 | 11/2002 | Saitoh et al. |

FOREIGN PATENT DOCUMENTS

| JP | 06-053120 | 2/1994 |
| JP | 06-124872 | 5/1994 |
| JP | 07-183201 | 7/1995 |
| JP | 09-167735 | 6/1997 |
| JP | 2001-284212 | 10/2001 |
| JP | 2003-234285 | 8/2003 |
| JP | 2003-321419 | 11/2003 |
| WO | PCT/JP 2004/013592 | 11/2004 |

* cited by examiner

*Primary Examiner*—Henry Hung Nguyen
(74) *Attorney, Agent, or Firm*—Morgan & Finnegan, L.L.P.

(57) ABSTRACT

An illumination apparatus for illuminating a mask having a pattern, using light from a light source, includes a generating section for generating an effective light source distribution for a modified illumination to the mask, a polarization setting section for setting a predetermined polarization state in plural areas in the effective light source distribution, and an adjusting section for commonly controlling a polarization state of each area.

6 Claims, 11 Drawing Sheets

ILLUMINATION APPARATUS, EXPOSURE APPARATUS AND DEVICE MANUFACTURING METHOD

BACKGROUND OF THE INVENTION

The present invention relates generally to an illumination apparatus, and more particularly to an illumination apparatus used to expose an object, such as a single crystal substrate for a semiconductor wafer, a glass plate for a liquid crystal display ("LCD"), an exposure apparatus using the illumination apparatus and a device manufacturing method using the exposure apparatus.

The recent demands for smaller and lower profile electronic apparatuses increasingly require finer processing to the semiconductor devices mounted onto these electronic devices. The photolithography process is generally used to produce highly integrated devices, such as a semiconductor device, a LCD device and a thin film magnetic head. A projection exposure apparatus is a vital apparatus to this process and exposes a pattern of a photo-mask (or reticle) onto a substrate, such as a photoresist applied silicon wafer and glass plate.

The following equation gives the resolution R of the projection exposure apparatus, where $\lambda$ is a wavelength of the exposure light, NA is a numerical aperture of the projection optical system, and $k_1$ is a process constant determined by a development process:

$$R = k_1 \times \frac{\lambda}{NA} \quad (1)$$

Therefore, the shorter the wavelength and the higher the NA, the better the resolution. However, a shorter wavelength would disadvantageously reduce the transmittance through a glass material, the depth of focus decreases in inverse proportion to the NA, and a larger NA makes difficult a design and manufacture of a lens.

Accordingly, the resolution enhancement technology ("RET") has been recently proposed which reduces a value of the process constant $k_1$ for the fine processing. One RET is a modified illumination, which is also referred to as an oblique incidence illumination or an off-axis illumination. The modified illumination arranges an aperture stop with a light-shielding plate on an optical axis in an optical system near an exit surface of a light integrator that forms a uniform surface light source, and introduces the exposure light obliquely to a mask. The modified illumination can form an annular illumination, a quadrupole illumination, etc. by controlling a shape of the aperture stop.

On the other hand, prior art propose the modified illumination having only linearly polarized light in a desired direction for the enhanced image contrast. See, for example, Japanese Patent Applications, Publication Nos. ("JPs") 7-183201 and 6-053120. JP 7-183201 uses a filter to remove the light if the light does not have a desired polarization direction. JP 6-053120 discloses a method for creating the linearly polarized light in a desired direction by using a $\lambda/2$ phase plate and the light that has been previously linearly polarized by a linear polarizer.

BRIEF SUMMARY OF THE INVENTION

The present invention is directed to an illumination apparatus that can set linearly polarized light in a desired direction to an arbitrary modified illumination without lowering the illumination efficiency, and easily correct any deteriorations of the degree of polarization of the linearly polarized light, an exposure apparatus having the illumination apparatus, and a device manufacturing method using the exposure apparatus.

An illumination apparatus according to one aspect of the present invention for illuminating a mask having a pattern, using light from a light source, includes a generating section for generating an effective light source distribution for a modified illumination to the mask, a polarization setting section for setting a predetermined polarization state in plural areas in the effective light source distribution, and an adjusting section for commonly controlling a polarization state of each area.

An illumination method according to another aspect of the present invention for illuminating a mask that has a pattern, using light from a light source, includes the steps of generating an effective light source distribution for a modified illumination to the mask, setting predetermined polarization states to plural areas symmetrically in the effective light source distribution, commonly controlling each polarization state of each area, detecting a degree of polarization set by the setting step, and controlling a polarization of the light used for the generating step, based on a result of the detecting step.

An exposure apparatus includes the above illumination apparatus for illuminating a mask, and a projection optical system for projecting a pattern of a mask onto an object to be exposed. A device manufacturing method according to still another aspect of the present invention includes the steps of exposing an object using the above exposure apparatus, and developing the object exposed. Claims for a device manufacturing method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
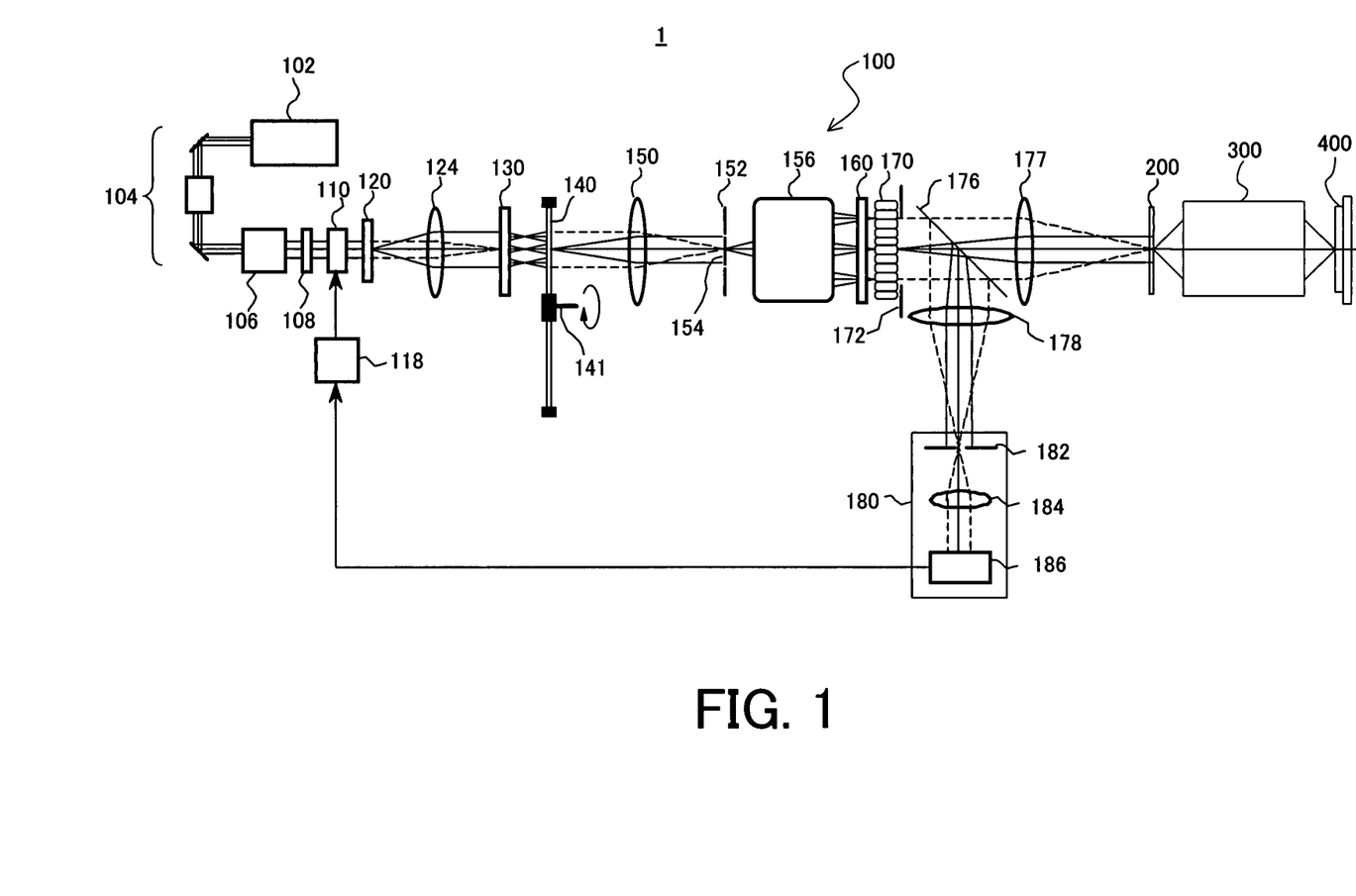
FIG. 1 is a schematic block diagram of an exposure apparatus.

Referring now to the accompanying drawings, a description will be given of an exposure apparatus 1 mounted with an illumination apparatus 100 according to one embodiment of the present invention. Here, FIG. 1 is a schematic block diagram of the exposure apparatus 1. The exposure apparatus 1 is a projection exposure apparatus that exposes a circuit pattern of a mask 200 onto an object (plate) 400, e.g., in a step-and-repeat or a step-and-scan manner. Such an exposure apparatus is suitable to a submicron or quarter-micron lithography process, and a description will be given below of this embodiment taking a step-and-scan exposure apparatus (which is also called "a scanner") as an example. The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

The exposure apparatus 1 includes an illumination apparatus 100, a mask 200, a projection optical system 300, and a plate 400.

The illumination apparatus 100 illuminates the mask 200 that has a circuit pattern to be transferred, and includes a light source 102, an illumination optical system (104 to 177), and a control system (118, 176, 178 and 180).

The light source 102 may use as a light source an ArF excimer laser with a wavelength of approximately 193 nm, and a KrF excimer laser with a wavelength of approximately 248 nm. A kind of laser, however, is not limited to excimer laser, and the number of laser units is not limited. A light source applicable to the light source unit 102 is not limited to a laser. One or more lamps may be used, such as a mercury lamp and a xenon lamp.

The illumination optical system is an optical system that maintains the light intensity and illuminates the mask 152 with a modified illumination with desired linearly polarized light. The illumination optical system includes a deflection optical system 104, a beam shaping optical system 106, a polarization control means 108, a phase adjusting means 110, an exit angle preserving optical element 120, a relay optical system 124, a multi-beam generating means 130, a diffraction optical element 140, a relay optical system 150, an aperture 152, a zooming optical system 156, a phase converter device 160, a multi-beam generating means 170, an aperture stop 172, and an irradiating means 177.

The deflection optical system 104 introduces the light from the light source 102 to the beam shaping optical system 106. The beam shaping optical system 106 can use, for example, a beam expander having a plurality of cylindrical lenses, etc. and convert an aspect ratio of the size of the sectional shape of a collimated beam from the laser light source into a desired value (for example, by changing the sectional shape from a rectangle to a square), thus reshaping the beam shape to a desired one. The beam shaping system 106 forms a beam that has a size and divergent angle necessary for illuminating a fly-eye lens as the multi-beam generating means 130 described later.

The polarization control means 108 includes a linear polarizer etc., and serves to remove unnecessary polarized light. When the light source 102 uses the ArF excimer laser, the exited light is almost linearly polarized light. Even if the polarization plane is disturbed in the deflection optical system 104, the light enters the polarization control means 108 while the linearly polarized light dominates the light. The polarization control means 108 serves to remove any unnecessary polarized light in the incident light so that the transmittable linear polarization direction accords with the polarization direction dominated by the incident light. Since the polarization control means 108 minimizes the polarized light to be shielded, the desired, linearly polarized light can be taken out efficiently.

Figure 2:
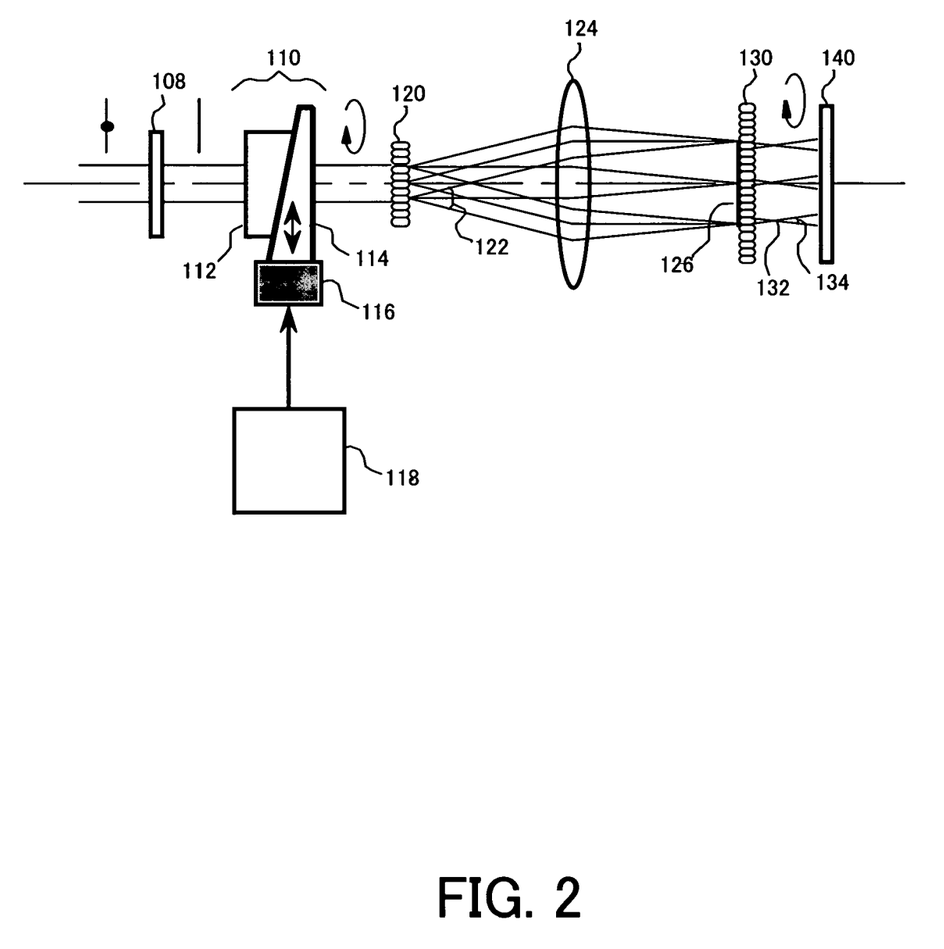
FIG. 2 shows an optical path around a phase adjusting means in the illumination apparatus shown in FIG. 1.

The phase adjusting means 110 converts the linearly polarized light that passes the polarization control means 108 into circularly polarized light. The phase adjusting means 110 serves as a phase plate that converts the linearly polarized light into perfectly or approximately circularly polarized light, and includes two quartz components, i.e., a crystal block 112 and a wedge crystal plate 114, and a fine-movement mechanism 116 that moves the wedge crystal plate 114. The crystal block 112 and the wedge crystal plate 114 are birefringent crystal having optical axes that are aligned in the same direction. The fine-movement mechanism 116 includes a micrometer head etc. Here, FIG. 2 is a schematic block diagram showing an optical path of the phase adjusting means 110 and its vicinity. In FIG. 2, both lines to the left and the right of the polarization control means 108 graphically indicate the polarization states of the light. The line to the right of the polarization control means 108 indicates that the light polarization direction is parallel to the paper surface and the black dot on the line to the left indicate that the polarized light perpendicular to the paper surface exists, which corresponds to the above "unnecessary polarized light". When the light passes the polarization control means 108, only the polarized light that is parallel to the paper surface enters the phase adjusting means 110 as indicated by the line to the right of the polarization control means 108, and the circularly polarized light is formed as indicated by the circle to the right of the phase adjusting means 110. The rotating arrows to the right of the phase adjusting means 110 and the exit angle preserving optical element 120 indicate the presence of circularly polarized lights in FIG. 2. FIG. 2 shows merely one embodiment, and it is not vital that the polarization direction is parallel to the paper surface at the left side of the phase adjusting means 110.

Under control of a driver 118, which receives information of a fine movement amount through a control signal from a control system as described later, the fine-movement mechanism 116 minutely moves the wedge crystal plate 114 in a longitudinal direction, and varies the thickness of the crystal part through which the light passes. Thereby, the phase adjusting means 110 provides the transmitting polarized light with a desired phase difference and varies its polarization state. The phase adjusting means 110 of this embodiment provides the incident light with the phase difference of $\lambda/4$, and emits the incident linearly polarized light as the circularly polarized light. When an effective light source distribution of a desired polarization state is unavailable due to the influence of the phase offset caused by the optical system, the phase adjusting means 110 adjusts the phase so as to cancel the phase offset amount as described later.

The exit angle preserving optical element 120 emits the light at a certain divergent angle, and includes a micro lens array. The relay optical system 124 condenses the light exited from the exit angle preserving optical element 120 into the multi-beam generating means 130.

The relay optical system 124 maintains a Fourier transformation relationship between an exit surface of the exit angle preserving optical element 120 and an incident surface of the multi-beam generating means 130 (or a relationship between an object surface and a pupil surface or a pupil surface and an image surface). An exit angle 122 in FIG. 2 is fixed by an exit NA of the lens element in the micro lens array, and the distribution 126 of the light incident upon the incident surface of the multi-beam generating means 130 is always fixed in place on the surface even when the optical axis of the incident light fluctuates, forming a uniform light intensity distribution by multiple beams superimposed under the Koehler illumination. The shape of the uniform illumination area 126 is similar to the outer shape of the fine lens in the exit angle preserving optical element 120. In this embodiment, the exit angle preserving optical element 120 is a honeycomb micro lens array and the illumination area 126 has an approximately regular hexagonal shape.

The multi-beam generating means 130 is an optical integrator, such as a fly-eye lens that has plural fine lenses, and the exit surface forms a light source plane with plural point light sources. Each fine lens may be made of a diffraction optical element, or a micro lens array formed by etching process on the substrate. The multi-beam generating means in this embodiment is an optical element that has plural optical axes, forms a finite area around each optical axis, and specifies one beam in each area.

Figure 3A:
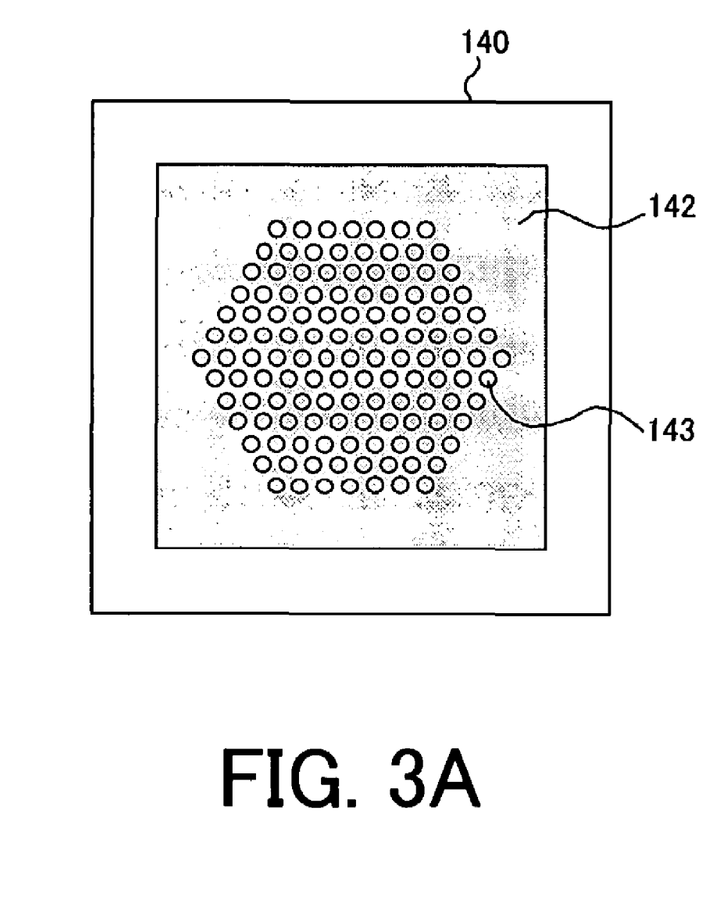
FIGS. 3A. and 3B are schematic front views of a diffraction optical element shown in FIG. 1.
Figure 3B:
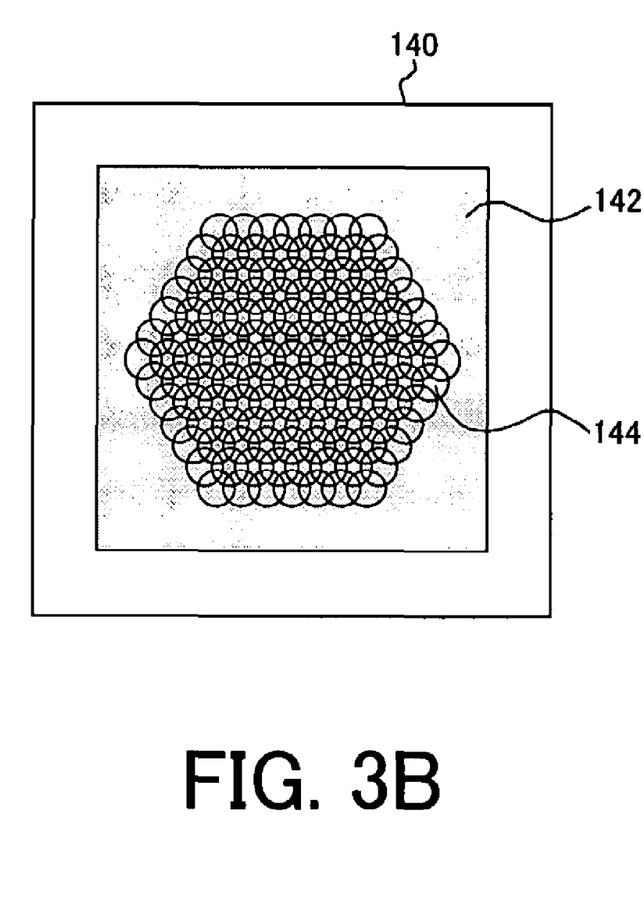

As shown in FIG. 2, the circularly polarized light emitted from the multi-beam generating means 130 has a constant exit angle 134 because of the fixed exit NA of the lens element. The light emitted at a desired exit angle 134 from each lens element is introduced as the circularly polarized light into the diffraction optical element 140. The diffraction optical element 140 is arranged slightly apart from the condensing points 132 of the lights, and illuminated by the incident light having the divergent angle 134. Referring to FIGS. 3A and 3B, a description will be given of this state.

FIGS. 3A and 3B are views for explaining the state of the incident light upon the diffraction optical element 140. In FIGS. 3A and 3B, 142 denotes a diffraction optical element surface on which a fine step shape is formed. The diffraction optical element surface is a surface of a quartz substrate, etc. 143 and 144 denote one light spot and indicate the light from one lens element when the multi-beam generating means 130 is a honeycomb micro lens array. In other words, the light incident upon the diffraction optical element 10 is a set of many light spots 143 and 144.

The sizes of the light spots 143 and 144 fluctuate in accordance with a distance between the optical element 140 and the condensing point 132 in FIG. 2. For example, as the distance increases, the size of the light spot 144 enlarges, as shown in FIG. 3B, so that respective spots overlap each other on the diffraction optical element surface 142. The proper setting of the distance between the diffraction optical element surface 140 and the condensing point 132 can protect the element from damages due to the energy concentration on the diffraction optical element surface 142.

The diffraction optical element 140 is a phase type computer generated hologram ("CGH") in this embodiment, and has a stepwise convexoconcave shape on the substrate surface. The CGH is a hologram produced by calculating an interference fringe between the object light and the reference light, and directly outputting from an imaging machine. The interference fringe shape that provides a desired light intensity distribution of the reproduced light can be easily calculated through repetitive calculations using a computer.

Figure 4A:
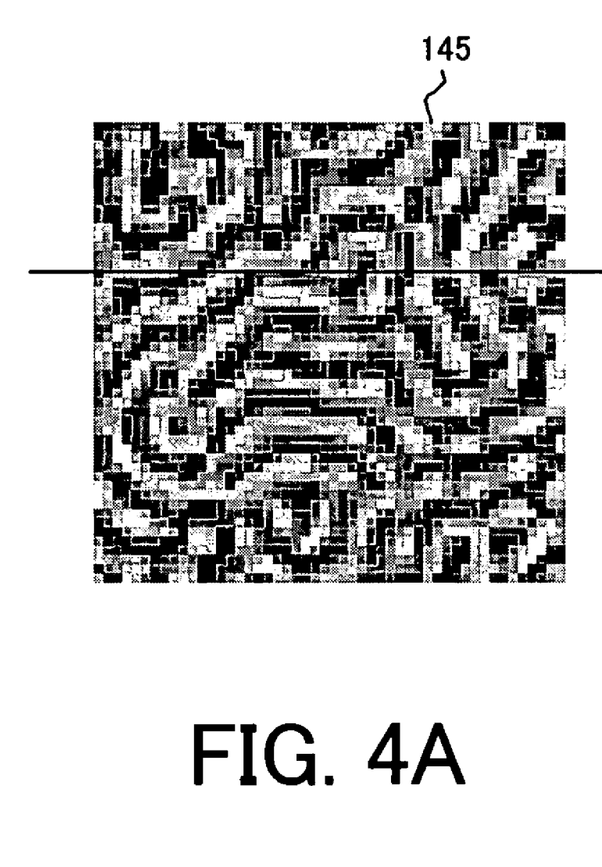
FIGS. 4A and 4B are a phase distribution and schematic sectional view of the diffraction optical element shown in FIG. 1.
Figure 4B:
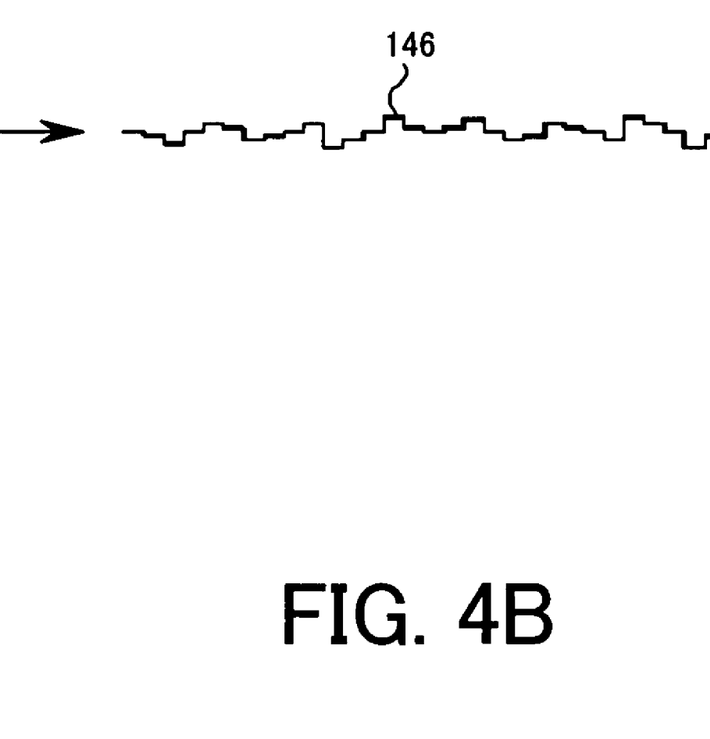

FIG. 4A is a front view of the thus-produced phase type CGH, and FIG. 4B is a schematic sectional view taken along an arrow in FIG. 4A. FIG. 4A denotes a convexoconcave phase distribution formed on a substrate as a gray scale distribution 145. The semiconductor device manufacturing technology is applicable to a production of the stepwise section like a section 146, and implements fine pitches relatively easily.

Figure 5A:
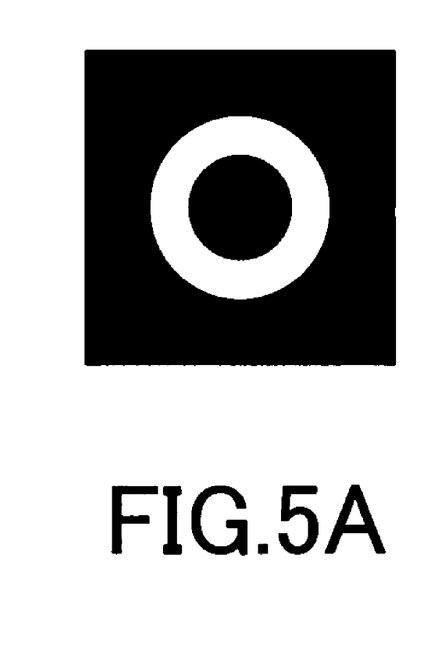
FIGS. 5A to 5C are exemplary light intensity distributions generated by the diffraction optical element shown in FIG. 1.
Figure 5B:
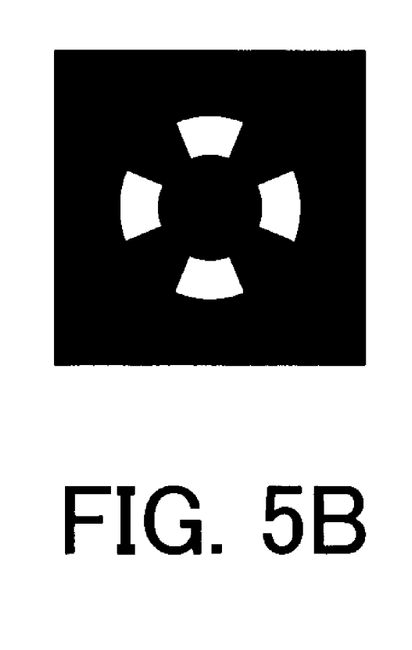
Figure 5C:
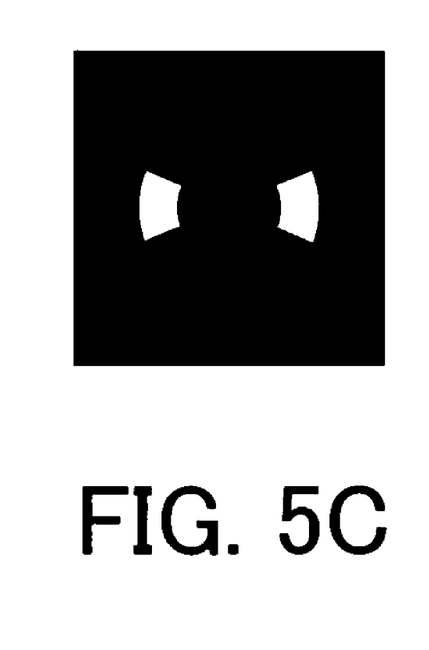

The desired light intensity distribution or the effective light source distribution obtained as a reproduced image of the diffraction optical element 140 includes, but is not limited to, a distribution suitable for a pattern to be exposed, such as an annular distribution shown in FIG. 5A, a quadrupole distribution shown in FIG. 5B, and a dipole distribution shown in FIG. 5C. These light intensity distributions are produced as reproduced images by the aperture 152 shown in FIG. 1, and projected onto the incident surface of the multi-beam generating means 170 after obtaining a desired magnification by the zooming optical system 156. This configuration provides a modified illumination, improving the resolving performance. This embodiment introduces the circularly polarized light into the phase type diffraction optical element 140, and makes the effective light source distribution of the circularly polarized light because the diffraction maintains the polarization surface. In addition, the illumination condition is easily variable as a switching means, such as a turret 141 shown in FIG. 1, switches plural diffraction optical elements that form effective light intensity distributions shown in FIGS. 5A to 5C. If the polarization control is unnecessary at the normal illumination time, the phase converter device 160 may be removed from the optical path.

The relay optical system 150 forms an effective light source distribution 154 having an approximately uniform intensity on the aperture 152, using the diffracted light that has experienced a calculated amplitude modification or phase modification at the diffraction optical element 140. The diffraction optical element 140 and the aperture 152 are arranged so that they have a Fourier transformation relationship. Due to this relationship, the divergent light from one arbitrary point of the diffraction optical element 140 contributes to the entire effective light source distribution 154. In other words, in FIGS. 3A and 3B, the arbitrary light in the light spots 143 and 144 forms on the aperture 152 the effective light source distribution 154 suitable for the modified illumination shown in FIG. 5A, 5B or 5C.

As shown in FIG. 2, the light incident upon the CGH 140 has a spread angle 134, and the effective light intensity distribution 154 slightly blurs according to this angle. However, the blur angle is defined by the spread angle 134, and the diffraction optical element 140 is designed so that the desired effective light source distribution 154 expects the blur amount. The effective light source distribution 154 is zoomed by the zooming optical system 156 at a desired magnification, and projected as a uniform light source image onto the incident surface of the multi-beam generating means 170 via the phase converter device 160.

A description will now be given of a method for efficiently converting a polarization direction of the light that forms the uniform light source image into a tangential direction (or a polarization direction shown by 168 in FIG. 8) using the phase converter device 160 when the effective light source distribution 154 is the annular illumination shown in FIG.

5A. The tangential polarization illumination illuminates a target surface with linearly polarized light orthogonal to the incident plane.

Figure 6:
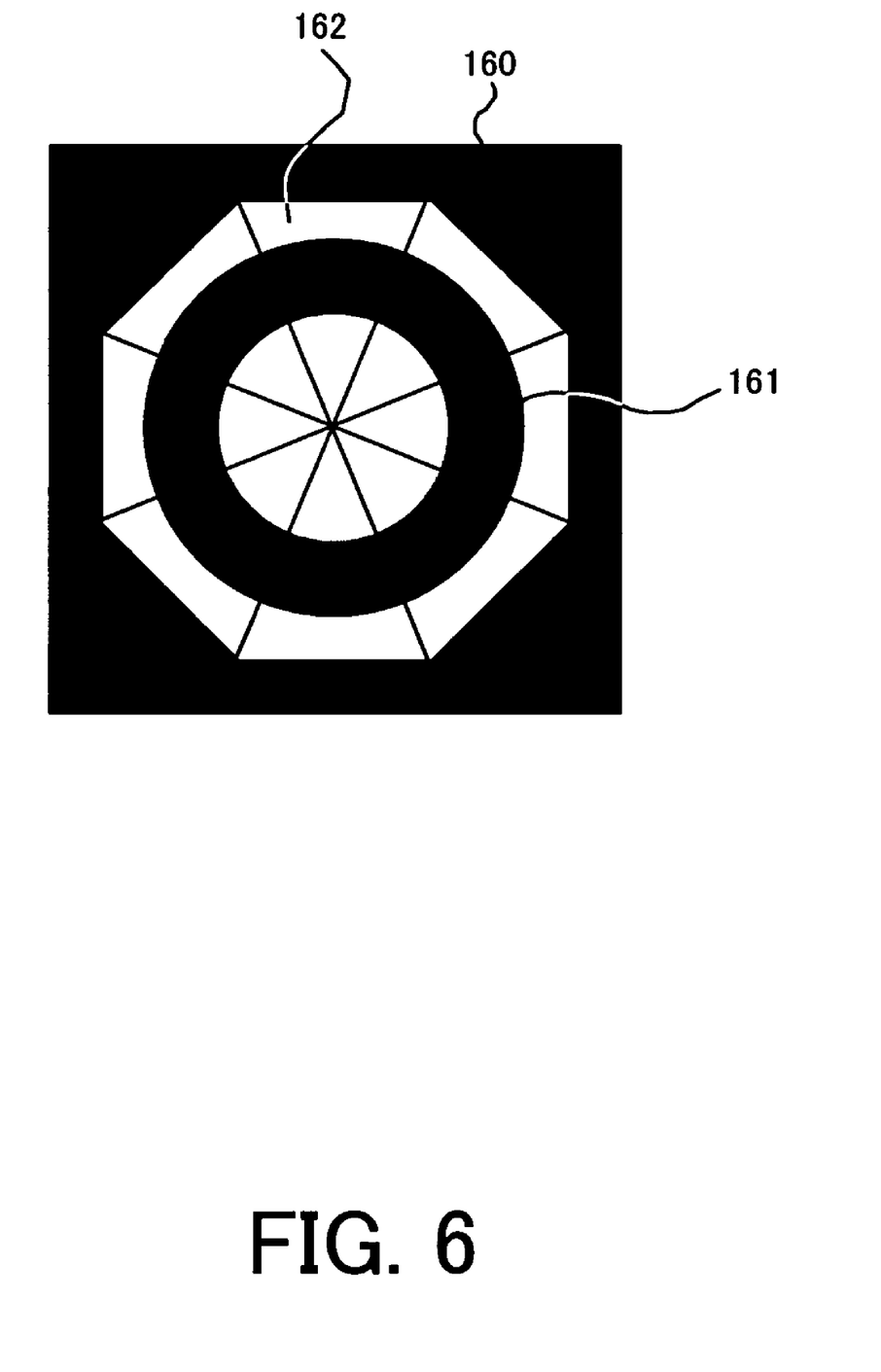
FIG. 6 is a schematic plane view of a phase converting device.

FIG. 6 is a schematic front view of the phase converter element 160 arranged near the incident surface of the multi-beam generating means 170. The phase converter device 160 of this embodiment includes eight λ/4 phase plates 162 having a center angle of 45° arranged in a radial direction, where λ is an exposure wavelength. The annular effective light source distribution 161 is a distribution formed at the incident side of the phase converter device 160 by the light emitted from the zooming optical system 156 after the zooming optical system 156 turns the effective light source distribution 154 to a desired magnification.

Figure 7:
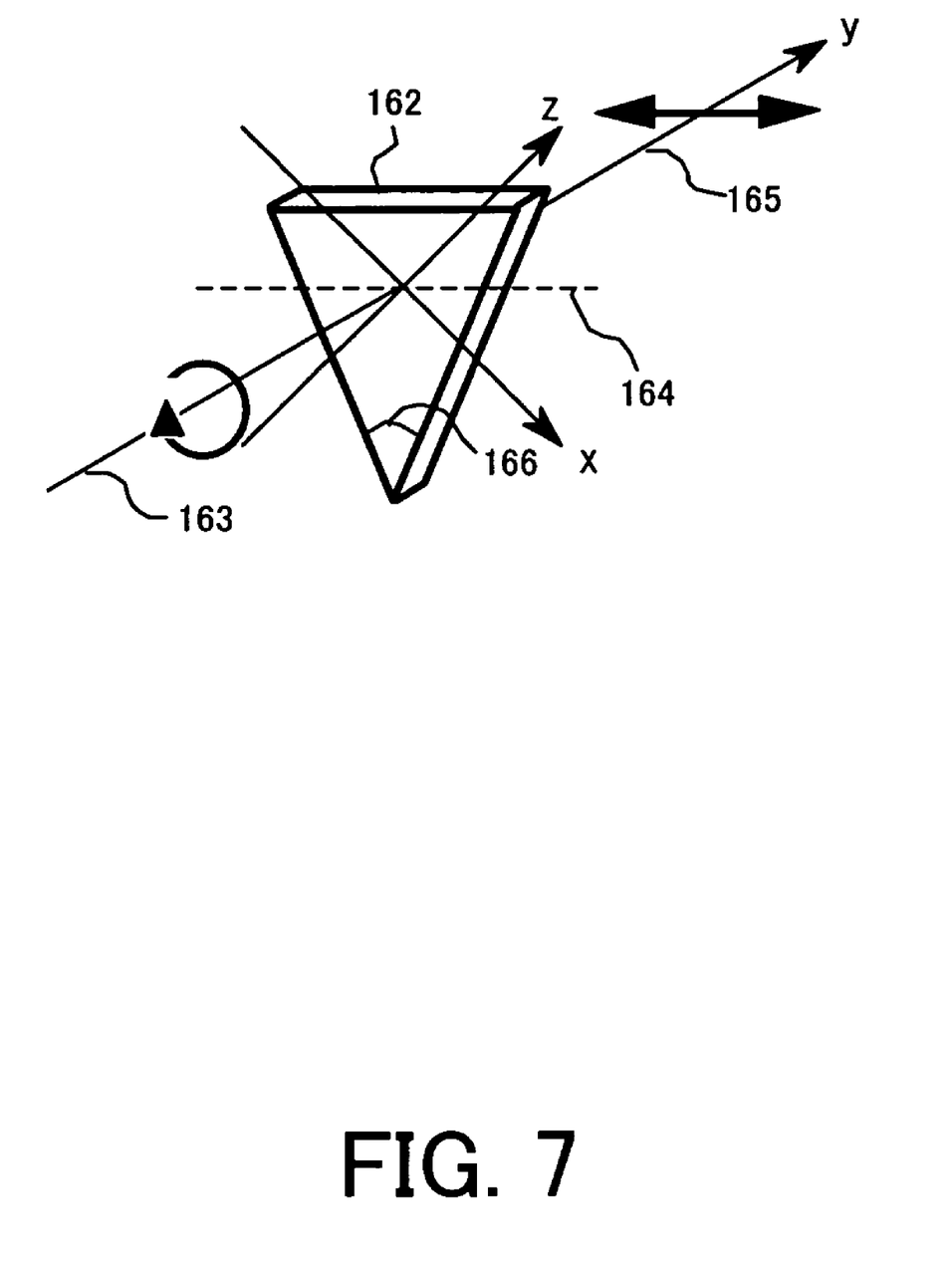
FIG. 7 is a schematic enlarged perspective view of components of the phase converting device shown in FIG. 6.

The λ/4 phase plate 162 includes, for example, a birefringent crystal, like quartz, and generates a phase difference of λ/4 wavelength (π/2) between a component that oscillates in the z direction (extraordinary ray) and a component that oscillates in the x direction (ordinary ray), where the z direction is assigned to its optical axis, and the circularly polarized light 163 enters the λ/4 phase plate 162 in the y direction, as shown FIG. 7. Thereby, the linearly polarized light 165 that oscillates in an azimuth of 45° or in a direction 164 is obtained on the xz plane. The λ/4 phase plate 162 has a thickness of the birefringent crystal corresponding to the desired phase difference as shown in FIG. 7, and manufactured as an isosceles triangle having a vertical angle 166 of 45°. The optical axis z is set so that the linearly polarized light 165 has a horizontal direction component when the vertical angle 166 is located at the bottom. The phase converter device 160 is made by fixing the λ/4 phase plates 162 by a proper frame around the vertical angle 166 in a radial direction.

The annular effective light source distribution 154 is an image (or light intensity distribution) formed by introducing the circularly polarized light into the diffraction optical element 140, or the circularly polarized light, as discussed with reference to FIG. 2. Therefore, when the annular image formed at the incident side of the phase converter device 160 is schematically shown as in FIG. 8, the light of the annular light intensity distribution from the zooming optical system 156 incident upon the area of each λ/4 phase plate 162 is the circularly polarized light 167. When the circularly polarized light 167 passes the phase converter device 160, the light incident upon the multi-beam generating means 170 becomes linearly polarized light 168 that has polarization component in a tangential direction (of the annulus) as shown by arrows in shown in FIG. 8.

The effective light source distribution for the modified illumination includes dipole and quadrupole distributions shown in FIGS. 5B and 5C. FIGS. 9A and 9B show the dipole effective light source distribution, where FIG. 9A corresponds to the lower left diagram in FIG. 8 and FIG. 9B corresponds to the lower right diagram in FIG. 8. FIGS. 9C and 9D show the quadrupole effective light source distribution, where FIG. 9C corresponds to the lower left diagram in FIG. 8 and FIG. 9D corresponds to the lower right diagram in FIG. 8. As discussed above, when CGHs that are designed and manufacture so as to provide these distributions, are mounted on the turret 141, it is switched for use as the necessity arises.

The multi-beam generating means 170 is an optical integrator, such as a fly-eye lens that has plural fine lenses, and its exit surface forms a light source plane with plural point light sources. Each fine lens may be made of a diffraction optical element, or a micro lens array formed by etching process on the substrate.

Figure 8:
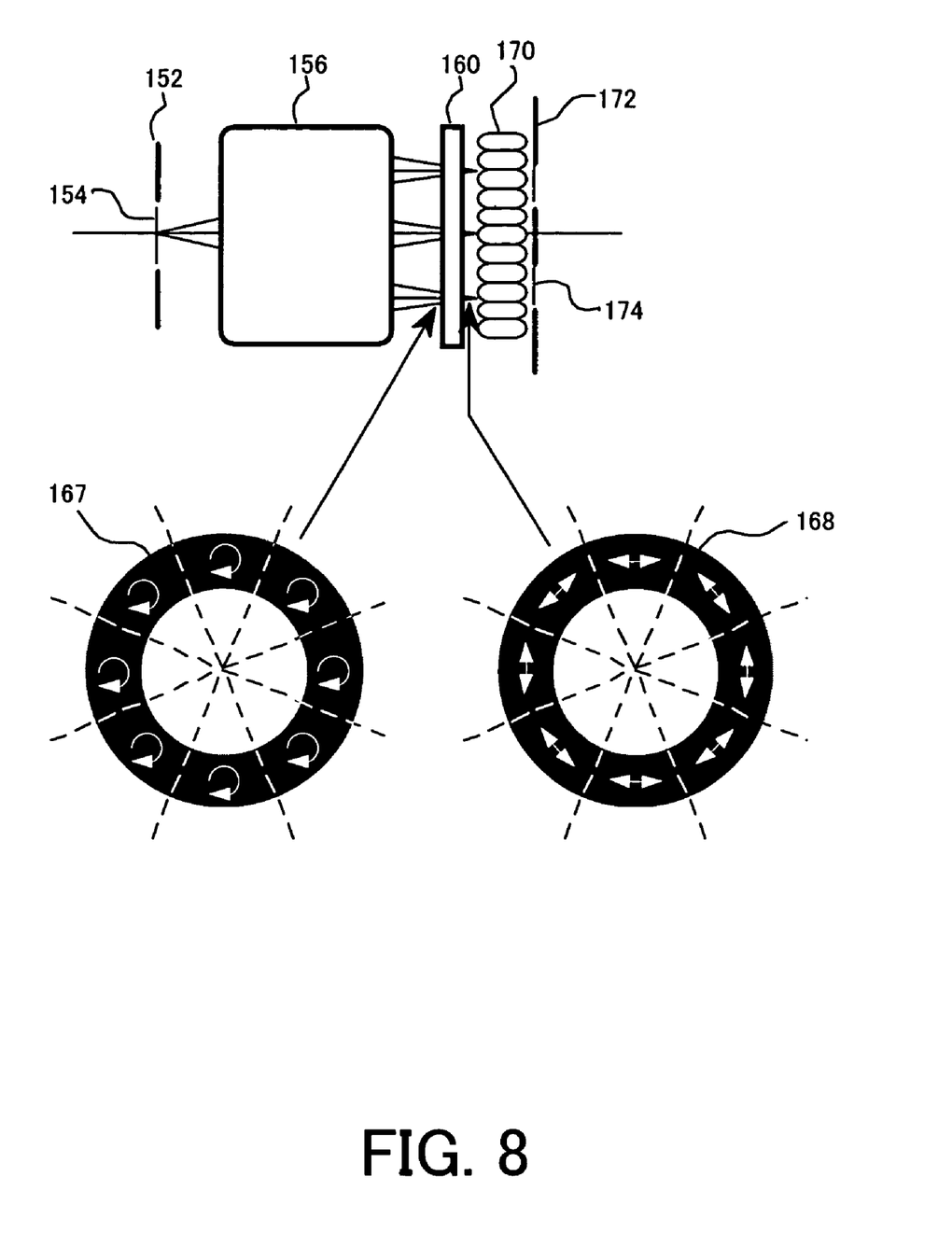
FIG. 8 is a schematic view for explaining polarization states of an incident surface and an exit surface of the phase converting device shown in FIG. 1.
Figure 9A:
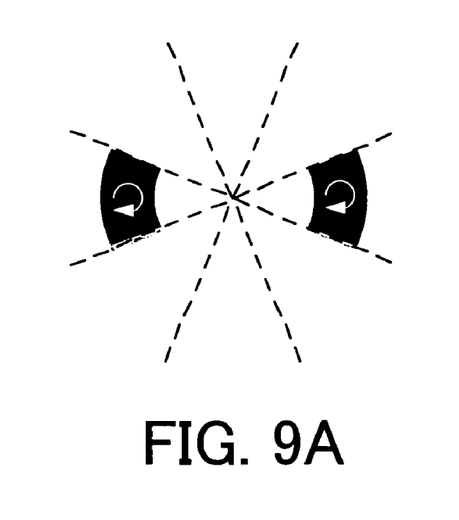
FIGS. 9A to 9D are schematic views for explaining a variation of polarization states of an incident surface and an exit surface of the phase converting device shown in FIG. 8.
Figure 9B:
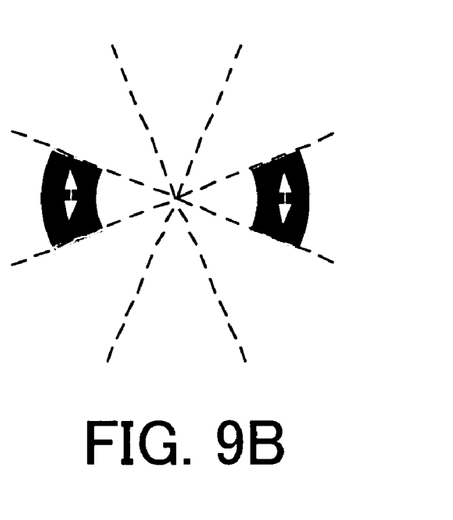
Figure 9C:
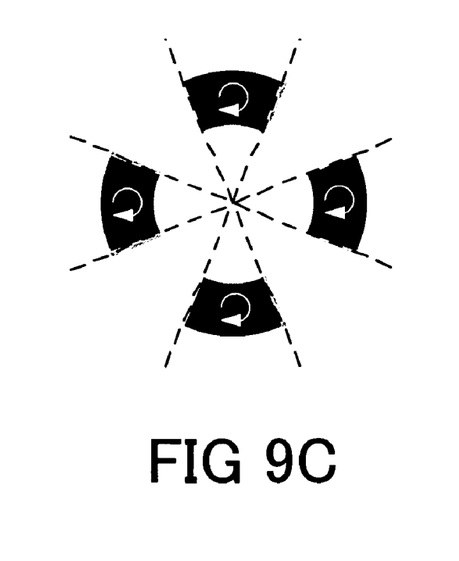
Figure 9D:
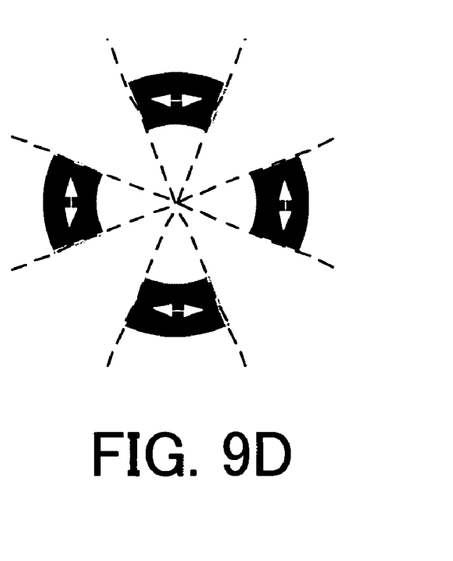

Referring to FIG. 8, when the desired uniform light source image 168 is projected onto the incident surface of the multi-beam generating means 170, the effective light source distribution is transferred to the exit surface 174. Since the aperture stop 172 that corresponds to the annular light source image is arranged at the exit side of the multi-beam generating means 170, only the secondary light source distribution can pass the opening in the aperture stop 172, and the polarization component distributes in the tangential direction like the image 168. Simultaneously, the aperture stop 172 shields the unnecessary light.

Turning back to FIG. 1, the control system includes the driver 118, a half mirror 176, a condenser optical system 178, and a degree-of-polarization monitoring system 180. The driver 118 moves the phase adjusting means 110 in the longitudinal direction as shown in FIGS. 1 and 2, provides a desired phase difference to the light that passes the phase adjusting means 110, and changes the polarization state.

The half mirror 176 deflects part of the light from the multi-beam generating means 170. The condenser optical system 178 condenses the light deflected by the half mirror 176. The degree-of-polarization monitoring system 180 determines and controls the moving amount of the driver 118 based on the light from the condenser optical system 178, and includes a pinhole 182, a condenser optical system 184, and a sensor unit 186. The pinhole 182 is arranged on the focal plane of the condenser optical system 178, and is conjugate with the mask 200 as the target surface to be illuminated. The condenser optical system 184 introduces the light that passes the pinhole 182 to the sensor unit 186. The sensor unit 186 includes plural linear polarizers, a light receiving element, and a CPU. Plural incident surfaces in the sensor unit 186 and the aperture stop 172 have a conjugate relationship. The operating part that operates the moving amount of the driver may be integrated with the driver 118.

The mask 200 is made for example, of quartz, and has a circuit pattern (or an image) to be transferred. It is supported and driven by a mask stage. The diffracted light from the mask passes the projection optical system 300, and then is projected onto the plate 400. The mask 200 and the plate 400 are located in an optically conjugate relationship. Since the exposure apparatus 1 of this embodiment is a scanner, the mask 200 and the plate 400 are scanned at a speed ratio of the reduction ratio. Thus, the pattern of the mask 152 is transferred to the plate 172. If it is a step-and-repeat exposure apparatus (referred to as a "stepper"), the mask 200 and the plate 400 remain still in exposing the mask pattern.

The projection optical system 300 may use a (dioptric) optical system solely including a plurality of lens elements, a (catadioptric) optical system including a plurality of lens elements and at least one mirror, an optical system including a plurality of lens elements and at least one diffraction optical element such as a kinoform, and a (catoptric) optical system of a full mirror type, and so on. Any necessary correction of the chromatic aberrations may use a plurality of lens units made from glass materials having different dispersion values (Abbe values) or can arrange a diffraction optical element such that it disperses in a direction opposite to that of the lens unit. The projection optical system is applicable to a so-called immersion exposure that fills the fluid in a space between the plate 400 and the projection optical system 300's final lens at the image side so as to make the NA greater than 1 for use with exposure at higher resolution.

The plate 400 is an exemplary object to be exposed, such as, a wafer and a LCD. A photoresist is applied to the plate 400. The stage (not shown) supports the plate 400 via a chuck (not shown). The mask 200 and plate 400 are, for example, scanned synchronously. The positions of the stage (not shown) and mask stage (not shown) are monitored, for example, by the interferometer, so that both are driven at a constant speed ratio.

A description will now be given of an operation of the exposure apparatus 1. The light emitted from the light source 102 is deflected by a deflection optical system 104 to the beam shaping optical system 106. The light that enters the beam shaping optical system 106 is shaped into a predetermined shape, and the polarization control means 108 removes the unnecessary linearly polarized lights. Next, the phase adjusting means 110 converts the linearly polarized light into the circularly polarized light, and the exit angle preserving optical element 120 divides the light into plural point light sources. Next, the light from the exit angle preserving optical element 120 is incident as the circularly polarized light upon the multi-beam generating means 130 via the relay optical system 124.

The circularly polarized light from the multi-beam generating means 130 enters the diffraction optical element 140 while maintaining the exit NA, and is converted into the desired modified illumination. The diffracted light that is amplitude-modified or phase-modified by the diffraction optical element 140 forms the effective light source distribution1 154 on the aperture 152 via the relay lens 152. Next, the effective light source distribution 154 is zoomed by the zooming optical system 156, converted into the linear polarized light by the phase converter device 160, incident upon the multi-beam generating means 170.

The light exited from each fine lens element in the multi-beam generating means 170 is superimposed on the mask 200 as the target surface by the irradiating means 177 and, for example, Koehler-illuminates the target surface for the entirely uniform light intensity distribution. The mask 200 is placed on the mask stage, and driven during exposure in the scanning exposure apparatus. The light that passes the mask 200 and reflects the mask pattern is imaged onto the plate 400 fixed on the stage via the wafer chuck (not shown) by the projection optical system 300 at a projection magnification (such as ¼ and ⅕). The wafer chuck is provided on the wafer stage, and driven during the exposure.

The phase converter device 160 converts a phase, but does not shield the light as in a filter. Therefore, no decrease of the light intensity or throughput occurs. The modified illumination provides a high-resolution exposure. The effective light source illumination uses the linearly polarized light in a tangential direction, and improves the image contrast.

Due to the influence of the manufacture errors of the optical element in the illumination optical system, and the poor birefringence performance of the glass material and the antireflection coating, the phase offset can occur symmetrically to the center axis and the tangentially linear polarization can turn slightly to an elliptical polarization. In this case, the phase adjusting means 110 and the control system adjust a phase and the degree of polarization. In other words, the half mirror 176 extracts (about several percentages of) part of the exited light from each fine lens element in the multi-beam generating means 170, and the condenser optical system 178 condenses the light into the pinhole 182 in the degree-of-polarization monitoring system 180. Since the pinhole 182 and the mask 200 have a conjugate relationship, the uniform illumination area is formed in the pinhole 182. Since the incident surface of the sensor unit 186 is conjugate with the aperture stop 172, the effective light source distribution is formed on the incident surface of the sensor unit 186. As a result, the sensor unit 186 measures the degree of polarization at plural positions in the effective light source distribution, and measures the intensities of different components from the desired linearly polarized light in the tangential direction.

The CPU in the sensor unit 186 processes a detection signal as a result of the measurement, calculates the fine movement amount, and sends the amount to the driver 118. In response, the driver 118 drives the phase adjusting means 110 so that the phase adjusting means 110 cancels the phase offset. As a consequence, the tangential polarization is adjusted to the approximately linearly polarized light.

While the degree-of-polarization monitoring system 180 extracts the part of the light during the exposure through the half mirror 176 and the condenser optical system 178, the half mirror 176 may be inserted into the optical path only before and after the exposure so as to measure the degree of polarization, and removed from the optical path during the exposure so as not to shield part of the light. In addition, the mask may be removed from the optical path before and after the exposure, and the degree-of-polarization monitoring system 180 may be arranged instead of the mask so as to measure the degree of polarization.

While the illumination apparatus 100 illuminates the mask 200 at the entirely uniform light intensity, the exited light from each fine area on the exit surface of the multi-beam generating means 170 may have different angles in two directions and the plate 400 may be exposed by scanning a slit-shaped exposure area.

Even when the light from the light source 102 fluctuates minutely due to the disturbance, the light from the exit angle preserving optical element 120 maintains the exit angle 122 as shown in FIG. 2, and the incident light position does not change upon the multi-beam generating means 130. In other words, the position of the light intensity distribution 126 is fixed. In addition, the light from the multi-beam generating means 130 fixes the exit angle 134, and the incident light upon the diffraction optical element 140 does not fluctuate substantially. As a result, the illumination apparatus 100 is a very stable system relative to the fluctuations of the light from the light source.

The illumination apparatus 100 does not affect the illumination area even when the light from the light source fluctuates, and the CGH forms the light intensity distribution for an arbitrary modified illumination. In addition, the illumination apparatus 100 can provide the linearly polarized light in the tangential direction without lowering the illumination efficiency relative to the arbitrary modified illumination condition. Moreover, the illumination apparatus 100 can enhance the degree of polarization of the linearly polarized light and improve the image contrast by removing the influence of the phase offset on the polarization caused by the optical element in the illumination optical system.

Figure 10:
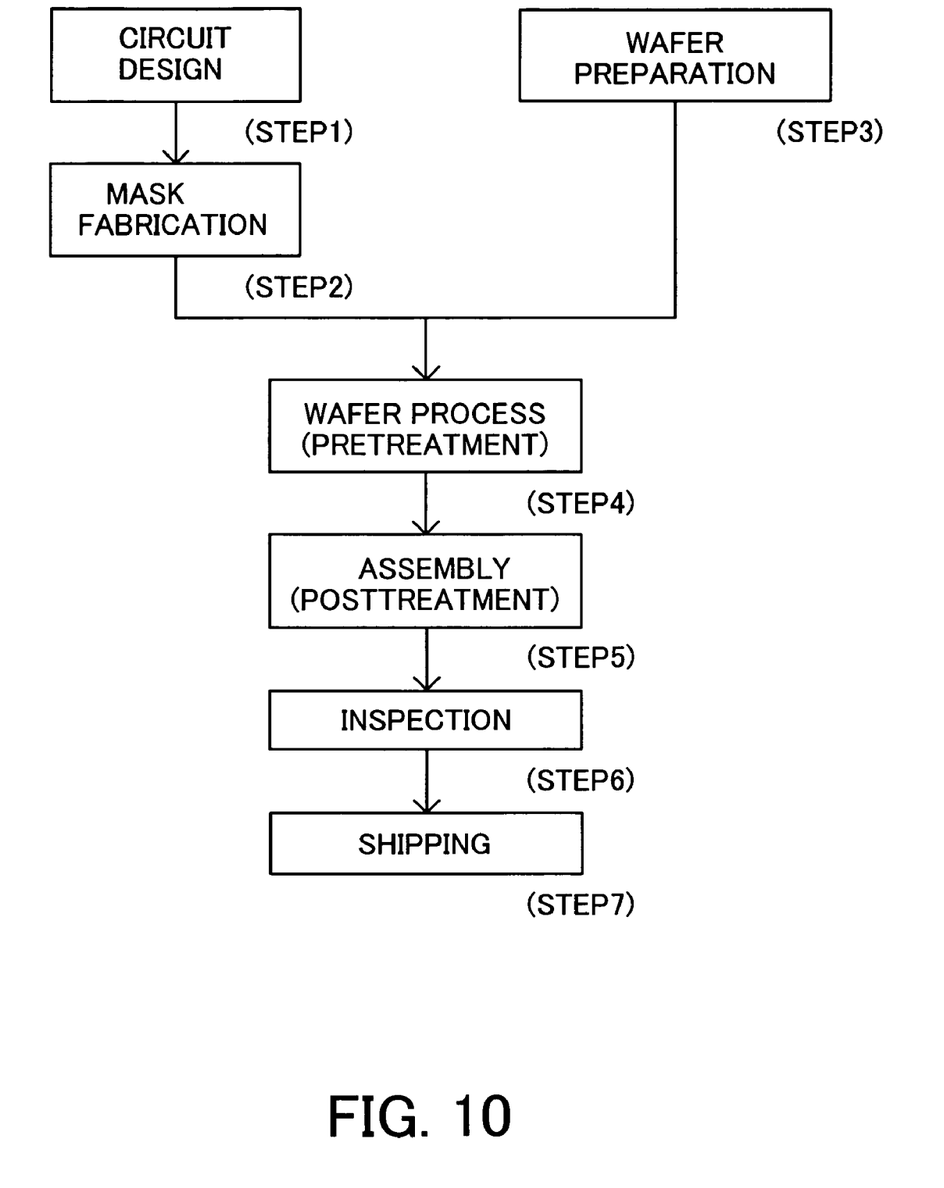
FIG. 10 is a flowchart for explaining a method for fabricating devices (semiconductor chips such as ICs, LSIs, and the like, LCDs, CCDs, etc.).
Figure 11:
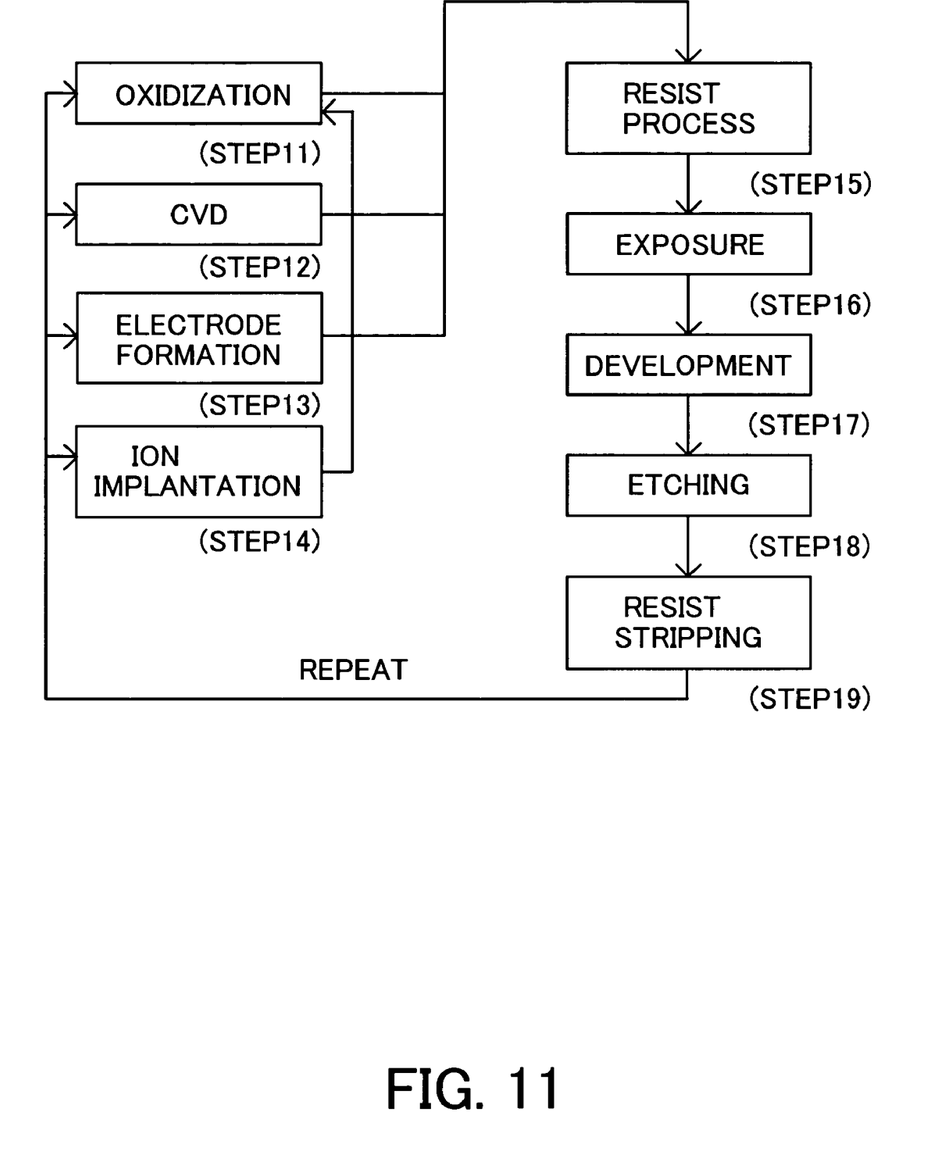
FIG. 11 is a detailed flowchart for Step 4 of wafer process shown in FIG. 10.

Referring now to FIGS. 10 and 11, a description will now be given of an embodiment of a device manufacturing method using the exposure apparatus 1. FIG. 10 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 11 is a detailed flowchart of the wafer process in Step 4 shown in FIG. 10. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a mask pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The manufacture of high-resolution devices with good productivity and economical efficiency (such as semiconductor devices, LCD devices, image pickup devices (e.g., CCDs), and thin film magnetic heads) have been difficult to manufacture. Thus, the device manufacturing method that uses the exposure apparatus 1, and its resultant (intermediate and final) products also constitute one aspect of the present invention.

The present embodiment thus can provide an illumination apparatus that can set linearly polarized light in a desired direction to an arbitrary modified illumination without lowering the illumination efficiency, and easily correct any deteriorations of the degree of polarization of the linearly polarized light, an exposure apparatus having the illumination apparatus, and a device manufacturing method using the exposure apparatus.

This application claims a foreign priority based on Japanese Patent Application No. 2004-078065, filed on Mar. 18, 2004, which is hereby incorporated by reference herein.

As many apparently widely different embodiments of the present invention can be made without departing from the sprit and scope thereof, it is to be understood that the invention is not limited to the specific embodiments thereof except as defined in the claims.

What is claimed is:

1. An illumination apparatus for illuminating a mask having a pattern, using a light from a light source, said illumination apparatus comprising:
    a diffraction optical element for generating an effective light source distribution for a modified illumination to the mask;
    a polarization setting section for setting a predetermined polarization state in plural areas in the effective light source distribution;
    an adjusting section for commonly controlling a polarization state of each area; and
    an exit angle preserving section for emitting the light from the light source at a predetermined divergent angle, wherein the diffraction optical element is arranged near a condensing point of said exit angle preserving section.

2. An exposure apparatus comprising:
    an illumination apparatus according to claim 1 for illuminating a mask; and
    a projection optical system for projecting a pattern of a mask onto an object to be exposed.

3. A device manufacturing method comprising the steps of:
    exposing an object using an exposure apparatus according to claim 2 and
    developing the object exposed.

4. An illumination apparatus for illuminating a mask having a pattern, using a light from a light source, said illumination apparatus comprising:
    a diffraction optical element for generating an effective light source distribution for a modified illumination to the mask;
    a polarization setting section for setting a predetermined polarization state in plural areas in the effective light source distribution;
    an adjusting section for commonly controlling a polarization state of each area;
    an exit angle preserving sections for emitting the light from the light source at a predetermined angle; and
    an optical integrator,
    wherein there is an optically Fourier transformation relationship between an exit surface of said exit angle preserving section and an incident surface of said optical integrator, and
    wherein the diffraction optical element is arranged near a condensing point of said optical integrator.

5. An exposure apparatus comprising:
    an illumination apparatus according to claim 4 illuminating a mask; and
    a projection optical system for projecting a pattern of a mask onto an object to be exposed.

6. A device manufacturing method comprising the steps of:
    exposing an object using an exposure apparatus according to claim 5; and
    developing the object exposed.

* * * * *